United States Patent
Hayashi et al.

(10) Patent No.: US 10,670,635 B2
(45) Date of Patent: Jun. 2, 2020

(54) CURRENT DETECTOR AND METER

(71) Applicant: HIOKI DENKI KABUSHIKI KAISHA, Nagano (JP)

(72) Inventors: Kazunobu Hayashi, Nagano (JP); Kenichi Seki, Nagano (JP); Hajime Yoda, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 55 days.

(21) Appl. No.: 16/021,304

(22) Filed: Jun. 28, 2018

(65) Prior Publication Data

US 2019/0004095 A1 Jan. 3, 2019

(30) Foreign Application Priority Data

Jun. 30, 2017 (JP) .................. 2017-129207

(51) Int. Cl.
*G01R 15/18* (2006.01)
(52) U.S. Cl.
CPC .................. *G01R 15/186* (2013.01)
(58) Field of Classification Search
None
See application file for complete search history.

(56) References Cited

U.S. PATENT DOCUMENTS

| 6,680,608 B2 * | 1/2004 | Kojovic | G01R 15/181 |
| | | | 324/117 R |
| 2017/0115328 A1 | 4/2017 | Seki et al. | |

FOREIGN PATENT DOCUMENTS

JP 06-55216 7/1994

* cited by examiner

*Primary Examiner* — Jas A Sanghera
(74) *Attorney, Agent, or Firm* — Greenblum & Bernstein, P.L.C.

(57) ABSTRACT

A current detector includes a ring-shaped core for inserting a wire; a detection winding on the core; and resistor connectors for connecting a resistor in series to the detection winding. The detection winding has a first winding at a first end and a second winding at a second end that are connected in series. The first winding and second winding each have n (where n is three or higher) first or second unit windings in series. The core surface is partitioned into 2n regions around the core. The first unit windings are formed in odd-numbered regions and the second unit windings are formed in even-numbered regions. A $j^{th}$ (where j is 1 to n) first unit winding from the first end and a $j^{th}$ second unit winding from the second end are not adjacent and are formed with an equal number of turns.

14 Claims, 3 Drawing Sheets

FIG. 5
COMPARATIVE EXAMPLE

CURRENT DETECTOR AND METER

FIELD OF THE INVENTION

The present invention relates to a current detector that includes a ring-shaped magnetic core and a detection winding formed on the magnetic core and that detects a current flowing on a measured wire that has been inserted through the magnetic core, and to a meter equipped with the current detector.

DESCRIPTION OF THE RELATED ART

A structure produced by forming a winding on a toroidal core disclosed in Patent Literature 1 (Japanese Laid-open Utility Model Publication No. H06-55216 (see page 7 and FIG. 1) is typically used as a structure that has a detection winding formed on a magnetic core to be used in this type of current detector. With this winding structure, the winding is continuously formed in a single layer around one part of a toroidal core.

SUMMARY OF THE INVENTION

However, the winding structure disclosed in Patent Literature 1 has a winding formed around only part of a toroidal core. For this reason, the present applicant supposed that when this winding structure is used without amendment as the structure of a detection winding on the magnetic core of a current detector, fluctuations will occur in the properties (for example, amplitude) of a detection signal outputted from the current detector (that is, a signal obtained by converting a current flowing in the detection winding to a voltage using a detection resistor) according to position inside the magnetic core of a measured wire that has been inserted. For this reason, the present applicant developed a current detector with a configuration where the winding is uniformly formed around the entire circumference of a toroidal core.

However, with the developed current detector mentioned above, although it is possible to reduce the fluctuations in the properties of the detection signal due to the position (or "wire position") inside the magnetic core of the measured wire that has been inserted, in recent years, there has been demand to further reduce the fluctuations for a current detector.

The present invention was conceived to solve the problem described above and has a principal object of providing a current detector that is capable of significantly reducing fluctuations in properties that occur in a detection signal according to the position of an inserted measured wire inside a magnetic core, and also a meter that is equipped with this current detector.

To achieve the stated object, a current detector according to the present invention comprises: a ring-shaped magnetic core through which a measured wire is inserted; a detection winding formed on an outer surface of the magnetic core; and a pair of resistor connecting terminals disposed on the detection winding for connecting a detection resistor, which converts a current flowing in the detection winding due to a measured current flowing on the measured wire that has been inserted through the magnetic core to a voltage, in series to the detection winding, wherein the detection winding is composed of a first winding at a first end side and a second winding at a second end side that is connected in series to the first winding, the first winding is constructed by connecting n (where n is an integer that is three or higher) first unit windings in series, the second winding is constructed by connecting n second unit windings in series, the outer surface is partitioned into 2n formation regions along a circumferential direction of the magnetic core, and the n first unit windings are formed in odd-numbered formation regions along the circumferential direction with one out of the 2n formation regions as a first formation region, the n second unit windings are formed in even-numbered formation regions out of the 2n formation regions along the circumferential direction, and a $j^{th}$ (where j is an arbitrary integer in a range of 1 to n, inclusive) first unit winding from the first end of the detection winding out of the first unit windings and a $j^{th}$ second unit winding from the second end of the detection winding out of the second unit windings are not adjacent and are formed with an equal number of turns.

Also, in the current detector according to the present invention, the detection resistor is connected between the pair of resistor connecting terminals.

Further, to achieve the stated object, a current detector according to the present invention comprises: a ring-shaped magnetic core through which a measured wire is inserted; a detection winding formed on an outer surface of the magnetic core; and a detection resistor that is connected in series to the detection winding and converts a current flowing in the detection winding due to a measured current flowing on the measured wire that has been inserted through the magnetic core to a voltage, wherein the detection winding is composed of a first winding at a first end side and a second winding at a second end side that is connected in series to the first winding, the first winding is constructed by connecting n (where n is an integer that is three or higher) first unit windings in series, the second winding is constructed by connecting n second unit windings in series, the outer surface is partitioned into 2n formation regions along a circumferential direction of the magnetic core, and the n first unit windings are formed in odd-numbered formation regions along the circumferential direction with one out of the 2n formation regions as a first formation region, the n second unit windings are formed in even-numbered formation regions out of the 2n formation regions along the circumferential direction, and a $j^{th}$ (where j is an arbitrary integer in a range of 1 to n, inclusive) first unit winding from the first end of the detection winding out of the first unit windings and a $j^{th}$ second unit winding from the second end of the detection winding out of the second unit windings are not adjacent and are formed with an equal number of turns.

Also, a meter according to the present invention comprises: a current detector including a ring-shaped magnetic core through which a measured wire is inserted, a detection winding formed on an outer surface of the magnetic core, and a pair of resistor connecting terminals disposed on the detection winding for connecting a detection resistor, which converts a current flowing in the detection winding due to a measured current flowing on the measured wire that has been inserted through the magnetic core to a voltage, in series to the detection winding, wherein the detection winding is composed of a first winding at a first end side and a second winding at a second end side that is connected in series to the first winding, the first winding is constructed by connecting n (where n is an integer that is three or higher) first unit windings in series, the second winding is constructed by connecting n second unit windings in series, the outer surface is partitioned into 2n formation regions along a circumferential direction of the magnetic core, and the n first unit windings are formed in odd-numbered formation regions along the circumferential direction with one out of the 2n formation regions as a first formation region, the n second unit windings are formed in even-numbered formation regions out of the 2n formation regions along the circumferential direction, and a $j^{th}$ (where j is an arbitrary integer in a range of 1 to n, inclusive) first unit winding from the first end of the detection winding out of the first unit windings and a $j^{th}$ second unit winding from the second end of the detection winding out of the second unit windings are not adjacent and are formed with an equal number of turns; a processor that measures a current value of the measured current based on the voltage converted by the detection resistor; and an outputter that outputs the measured current value.

Further, a meter according to the present invention comprises;

a current detector including a ring-shaped magnetic core through which a measured wire is inserted, a detection winding formed on an outer surface of the magnetic core; and a detection resistor that is connected in series to the detection winding and converts a current flowing in the detection winding due to a measured current flowing on the measured wire that has been inserted through the magnetic core to a voltage, wherein the detection winding is composed of a first winding at a first end side and a second winding at a second end side that is connected in series to the first winding, the first winding is constructed by connecting n (where n is an integer that is three or higher) first unit windings in series, the second winding is constructed by connecting n second unit windings in series, the outer surface is partitioned into 2n formation regions along a circumferential direction of the magnetic core, and the n first unit windings are formed in odd-numbered formation regions along the circumferential direction with one out of the 2n formation regions as a first formation region, the n second unit windings are formed in even-numbered formation regions out of the 2n formation regions along the circumferential direction, and a $j^{th}$ (where j is an arbitrary integer in a range of 1 to n, inclusive) first unit winding from the first end of the detection winding out of the first unit windings and a $j^{th}$ second unit winding from the second end of the detection winding out of the second unit windings are not adjacent and are formed with an equal number of turns; a processor that measures a current value of the measured current based on the voltage converted by the detection resistor; and an outputter that outputs the measured current value.

According to the current detectors and meters described above, by constructing the detection winding of the first winding on the first end side and the second winding on the second end side, constructing the respective windings of the n first unit windings and the n second unit windings, forming the first unit windings in odd-numbered formation regions, out of the 2n formation regions set by partitioning the outer surface of the magnetic core with one of the formation regions set as a first formation region, and forming the second unit windings in even-numbered formation regions out of the 2n formation regions so that the $j^{th}$ first unit winding and the $j^{th}$ second unit winding are not adjacent and have an equal number of turns, it is possible to significantly reduce fluctuations in properties that occur in a voltage (i.e., a voltage produced by conversion by the detection resistor (for the current detector according to claim 1, a detection resistor connected between a pair of resistor connecting terminals)) according to the position of the measured wire inside the magnetic core.

Also, according to the current detector and meter equipped with a pair of resistor connecting terminals, since it is possible to appropriately select a detection resistor with an appropriate resistance value in accordance with the current value of the current flowing in the detection winding (that is the current value of the measured current flowing in the measured wire) and to connect the selected resistor to the pair of resistor connecting terminals, it is possible to expand the measurement range of current values for the measured current.

According to the current detector and meter where the detection resistor is connected in advance to the detection winding, it is possible to omit the task of separately preparing a detection resistor.

Also, in the current detector according to the present invention, the $j^{th}$ second unit winding is formed in a formation region that is most distant along the circumferential direction from the formation region of the $j^{th}$ first unit winding.

According to the above current detector, since the $j^{th}$ first unit winding and the $j^{th}$ second unit winding that are electrically equal can be formed in formation regions that are the greatest distance apart, it is possible to reduce fluctuations in electrical losses, which means that it is possible to more significantly reduce fluctuations in the properties that occur in the voltage according to the position of the measured wire inside the magnetic core.

Further, in the current detector according to the present invention, the 2n formation regions are produced by partitioning into equal lengths, the n first unit windings are formed of an equal number of turns in order from the first unit winding on the first end side of the detection winding with the first formation region as a starting formation region, the n second unit windings are formed of an equal number of turns in order from the second unit winding on the second end side of the detection winding in the same direction as the first unit windings, with an even-numbered formation region that is most distant along the circumferential direction from the first formation region out of the 2n formation regions as a starting formation region.

According to the above current detector, in addition to the above effect obtained by forming the $j^{th}$ first unit winding and the $j^{th}$ second unit winding that are electrically equal in formation regions that are the greatest distance apart, it is possible to simply and reliably form the $j^{th}$ first unit winding and the $j^{th}$ second unit winding in formation regions that are the greatest distance apart.

It should be noted that the disclosure of the present invention relates to the contents of Japanese Patent Application No. 2017-129207 that was filed on Jun. 30, 2017, the entire contents of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a current detector and a meter will now be described with reference to the attached drawings.

Figure 1:
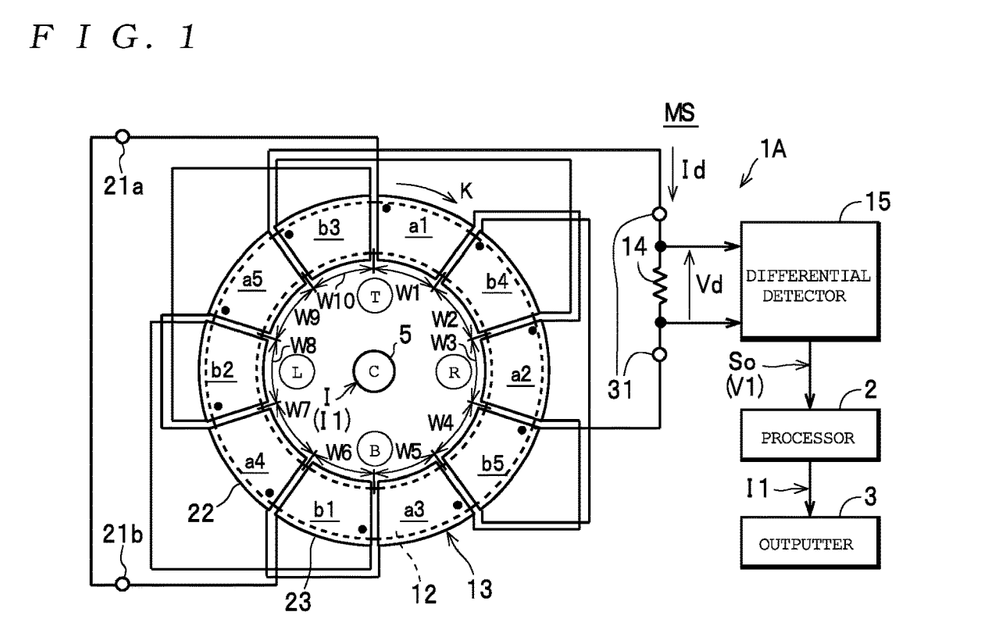
FIG. 1 is a diagram depicting a current detector 1A and a meter MS where the numbers of unit windings a and b that construct a detection winding 13 is odd.

As depicted in FIG. 1, a meter MS includes a current detector 1A as a "current detector" according to the present invention, a processor 2, and an outputter 3, and is configured so as to be capable of measuring a current value I1 of a current (or "measured current") I flowing on a measured wire 5.

As depicted in FIG. 1, the current detector 1A includes a magnetic core 12 that is ring-shaped (a circular ring as one example in the present embodiment, but a noncircular ring, such as an oval ring or a square ring may be used), a detection winding 13 formed on an outer surface of the magnetic core 12, a detection resistor 14, and a differential detector 15. The current detector 1A outputs a voltage signal So as a detection signal whose voltage value V1 changes in proportion to a current value I1 of a current I flowing on the measured wire 5 that has been inserted through the magnetic core 12.

Figure 2:
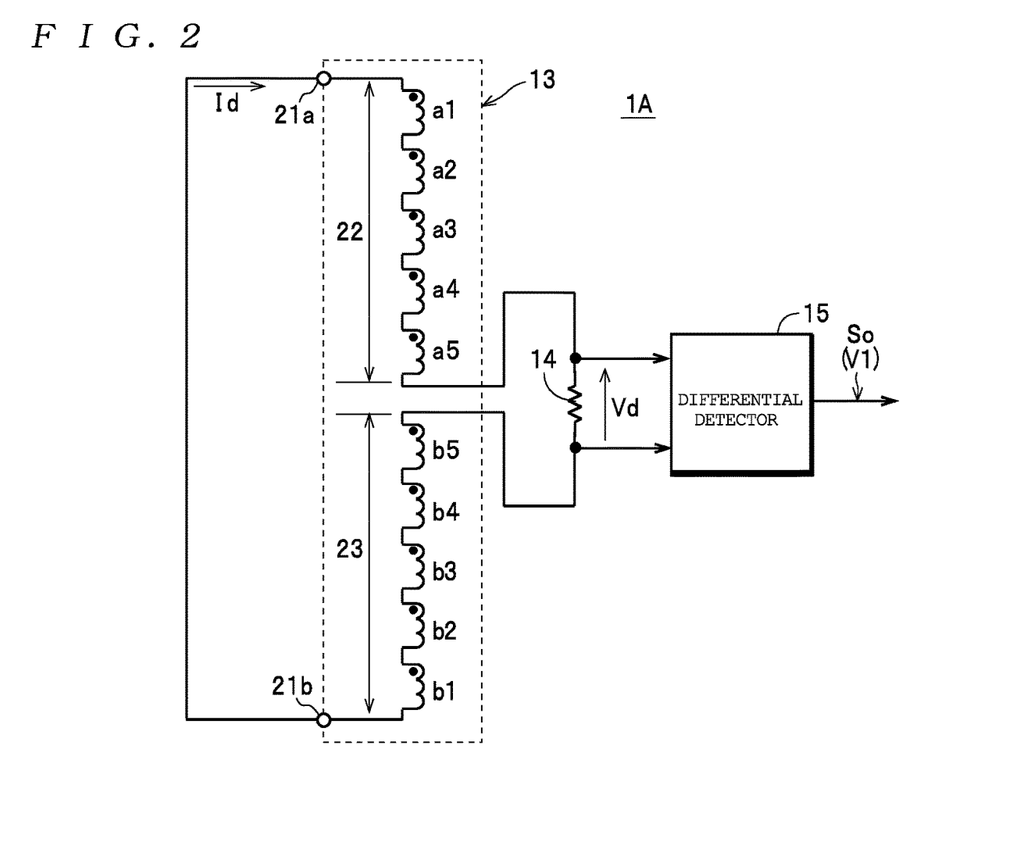
FIG. 2 is a diagram useful in explaining connections between the unit windings a and b that construct the detection winding 13 in FIG. 1.

As depicted in FIGS. 1 and 2, the detection winding 13 includes a first winding 22 on a first end 21a side (as one example, the winding start end) and a second winding 23 on the second end 21b side (as one example, a winding finish end). The second winding 23 is formed with the same number of turns and with the same winding direction as the first winding 22 and is connected in series to the first winding 22. As one example in the present embodiment, the first winding 22 and the second winding 23 are connected in series via the detection resistor 14. The first end 21a and the second end 21b of the detection winding 13 are also connected (shorted).

The first winding 22 is constructed by connecting a number n (where n is an integer that is three or higher, in the present embodiment five as one example of an odd number) first unit windings a1, a2, a3, a4, and a5 (hereinafter referred to as the "first unit windings a" when no distinction is made) with the same winding direction in that order in series from the first end 21a side. Likewise, the second winding 23 is constructed by connecting a number n (the same number as the first unit windings a, in the present embodiment five) second unit windings b1, b2, b3, b4, and b5 (hereinafter referred to as the "second unit windings b" when no distinction is made) with the same winding direction in that order in series from the second end 21b side. Note that the black circles in FIGS. 1 and 2 and in FIGS. 3, 4, and 5 described later indicate the winding start ends of the first unit windings a and the second unit windings b.

Here, the first unit windings a and the second unit windings b are configured by respectively forming a $j^{th}$ (where j is an arbitrary integer in a range of 1 to n, inclusive) first unit winding aj, out of the first unit windings a, from the first end 21a side of the detection winding 13 and a $j^{th}$ second unit winding bj, out of the second unit windings b, from the second end 21b side of the detection winding 13 with the same number of turns (so that the pair of the first unit winding a1 and the second unit winding b1, the pair of the first unit winding a2 and the second unit winding b2, . . . , and the pair of the first unit winding a5 and the second unit winding b5 are all formed with the same numbers of turns). In one preferred example configuration of the present embodiment, the n first unit windings a and the n second unit windings b are all formed with the same number of turns.

Next, the formation positions of the first unit windings a and the second unit windings b on the outer surface of the magnetic core 12 will be described. First, as depicted in FIG. 1, the outer surface of the magnetic core 12 is partitioned into 2n (i.e., the total number of the unit windings a and b) formation regions W along a circumferential direction of the magnetic core 12 (i.e., the circumferential direction from the winding start position to the winding finish position of the unit windings a and b, the direction of the arrow K). The formation regions W are regions for forming the first unit windings a and the second unit windings b one at a time, and are composed of ten formation regions W in the present embodiment. One of the formation regions W is set as a "first formation region W1", and then a "formation region W2", a "formation region W3", . . . , a "formation region W9", and a "formation region W10" are set in that order in the direction of the arrow K. In the present embodiment, since the first unit windings a and the second unit windings b each have the same number of turns, in keeping with this, the formation regions W are set by equally partitioning (i.e., partitioning into equal lengths) the outer surface of the magnetic core 12 along the circumferential direction.

With the current detector 1A, it is necessary to form the $j^{th}$ first unit winding aj out of the first unit windings a and the $j^{th}$ second unit winding bj out of the second unit windings b so as to not be adjacent (that is, so that the first unit winding a1 and the second unit winding b1 are not adjacent, the first unit winding a2 and the second unit winding b2 are not adjacent, . . . , the first unit winding a5 and the second unit winding b5 are not adjacent), and preferable to form these windings at the most distant positions along the circumferential direction (the direction of the arrow K) of the magnetic core 12. In the current detector 1A according to the present embodiment, as one example, the respective first unit windings a and second unit windings b are formed in the configuration described below to produce this preferable configuration.

In more detail, the five first unit windings a1, a2, a3, a4, and a5 are formed in the odd-numbered formation regions W1, W3, W5, W7, and W9 out of the ten formation regions W in that order from the first unit winding a1 on the first end 21a side of the detection winding 13 with the first formation region W1 as the starting formation region W. That is, the first unit winding a1 is formed in the formation region W1, the first unit winding a2 is formed in the formation region W3, the first unit winding a3 is formed in the formation region W5, the first unit winding a4 is formed in the formation region W7, and the first unit winding a5 is formed in the formation region W9.

Likewise, the five second unit windings b1, b2, b3, b4, and b5 are formed in the even-numbered formation regions W2, W4, W6, W8, and W10 out of the ten formation regions W in that order in the same direction as the first unit windings a from the second unit winding b1 on the second end 21b side of the detection winding 13, with the even-numbered formation region W that is the greatest distance from the first formation region W1 (in this example, as depicted in FIG. 1, the formation region W6) as the starting formation region W. In more detail, the second unit winding b1 is formed in the formation region W6, the second unit winding b2 is formed in the formation region W8, the second unit winding b3 is formed in the formation region W10, the second unit winding b4 is formed in the formation region W2, and the second unit winding b5 is formed in the formation region W4. By doing so, with the current detector 1A according to the present embodiment, the first unit winding aj and second unit winding bj are not adjacent by being formed at positions that the greatest distance apart (i.e., in two formation regions W whose relative positions are the greatest distance apart). Note that in order to form the first unit winding aj and the second unit winding bj in formation regions W that are not be adjacent, the number n of first unit windings a and second unit windings b is set at three or more as described above.

Note that the number n of first unit windings a and second unit windings b is not limited to the odd number described above and may be an even number. Regarding the formation positions on the outer surface of the magnetic core 12 of a current detector 1B that has an even number of the first unit windings a and the second unit windings b, it is again necessary to form the $j^{th}$ first unit winding aj and the $j^{th}$ second unit winding bj so as to not be adjacent, and preferable for the $j^{th}$ first unit winding aj and the $j^{th}$ second unit winding bj to be formed at positions that are the greatest distance apart along the circumferential direction (the direction of the arrow K) of the magnetic core 12. These formation positions will now be described with reference to FIGS. 3 and 4 with six as an example of an even number. Note that components that are the same as in the current detector 1A described above that has an odd number of first unit windings a and second unit windings b have been assigned the same reference numerals and duplicated description thereof is omitted.

Figure 3:
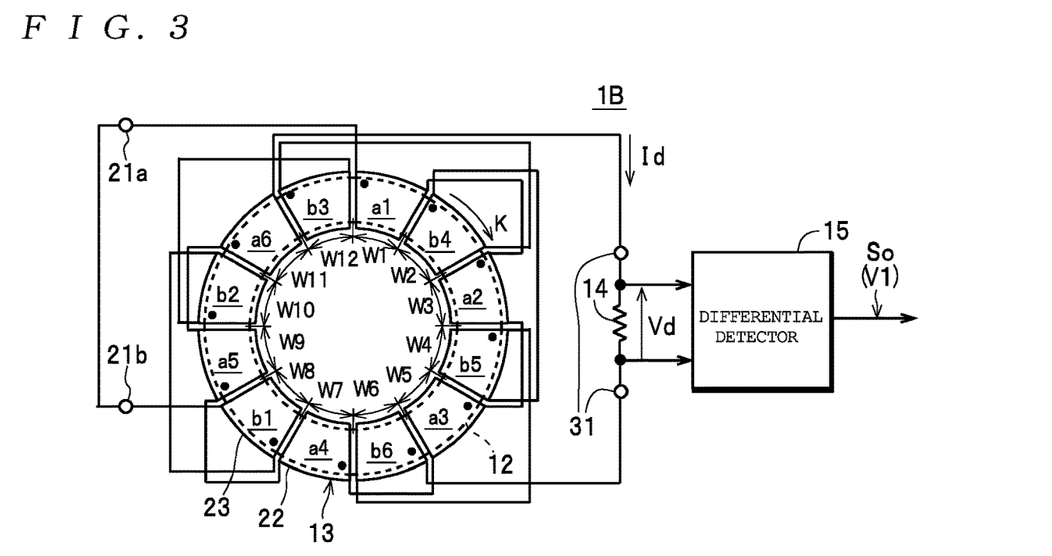
FIG. 3 is a diagram depicting a current detector 1B where the numbers of unit windings a and b is even.
Figure 4:
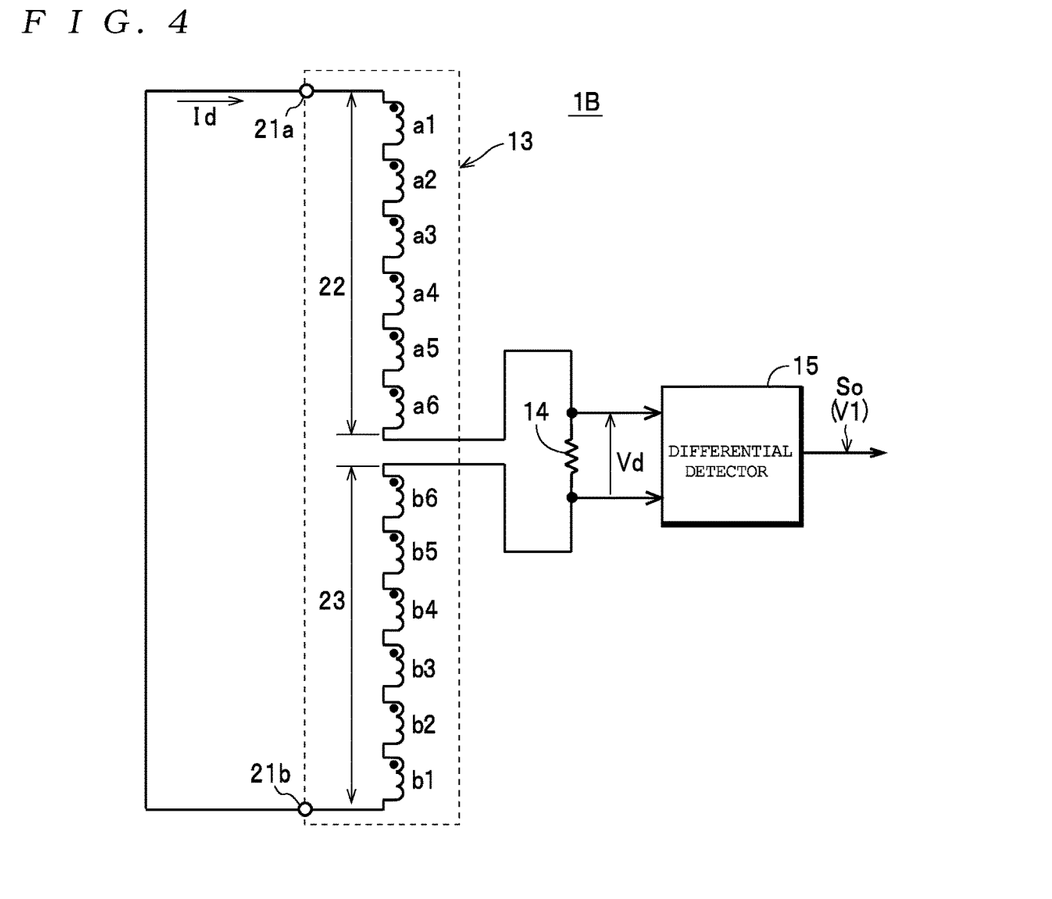
FIG. 4 is a diagram useful in explaining connections between the unit windings a and b that construct the detection winding 13 in FIG. 3.

In this current detector 1B, the first winding 22 is constructed by connecting six first unit windings a1, a2, a3, a4, a5, and a6 (hereinafter referred to as the "first unit windings a" when no distinction is made) in that order in series from the first end 21a side. Likewise, the second winding 23 is constructed by connecting six second unit windings b1, b2, b3, b4, b5, and b6 (hereinafter referred to as the "second unit windings b" when no distinction is made) in that order in series from the second end 21b side.

Also, on the outer surface of the magnetic core 12, 2n (i.e., 12 that is the total number of unit windings a and b) formation regions W1 to W12 are set along the circumferential direction (the direction of the arrow K) of the magnetic core 12.

Here, the six first unit windings a1, a2, a3, a4, a5, and a6 are formed in the odd-numbered formation regions W1, W3, W5, W7, W9, and W11 out of the twelve formation regions W in order from the first unit winding a1 on the first end 21a side of the detection winding 13 with the first formation region W1 as a starting formation region W. In more detail, the first unit winding a1 is formed in the formation region W1, the first unit winding a2 is formed in the formation region W3, the first unit winding a3 is formed in the formation region W5, the first unit winding a4 is formed in the formation region W7, the first unit winding a5 is formed in the formation region W9, and the first unit winding a6 is formed in the formation region W11.

Likewise, the six second unit windings b1, b2, b3, b4, b5, and b6 are formed in the even-numbered formation regions W2, W4, W6, W8, W10, and W12 out of the twelve formation regions W in order from the second unit winding b1 on the second end 21b side of the detection winding 13 along the same direction as the first unit windings a with an even-numbered formation region W at the greatest distance from the first formation region W1 as the starting formation region W. In this example, as depicted in FIG. 3, since two formation regions W6 and W8 are the even-numbered formation regions W at the greatest distance, either of the formation regions W6 and W8 may be set as the starting formation region W. As one example here, the formation region W8 is set as the starting formation region W. This means that the second unit winding b1 is formed in the formation region W8, the second unit winding b2 is formed in the formation region W10, the second unit winding a3 is formed in the formation region W12, the second unit winding b4 is formed in the formation region W2, the second unit winding b5 is formed in the formation region W4, and the second unit winding b6 is formed in the formation region W6. By doing so, with the current detector 1B according to the present embodiment, the first unit winding aj and the second unit winding bj are not adjacent by being formed at positions that the greatest distance apart (i.e., in two formation regions W whose relative positions are most distant).

Each end of the detection resistor 14 is connected to an input terminal, not illustrated, of the differential detector 15. Note that although the detection resistor 14 is connected (disposed) between the first winding 22 and the second winding 23 that construct the detection winding 13 as described above as one example of the present embodiment, the connected (disposed) position of the detection resistor 14 is not limited to this. As one example, although not illustrated, it is also possible to use a configuration where the first winding 22 and the second winding 23 are directly connected without the detection resistor 14 interposed therebetween, one of the first end 21a and the second end 21b of the detection winding 13 is connected to a reference potential (for example, ground potential) of the current detector 1A, and the detection resistor 14 is connected (disposed) between the other out of the first end 21a and the second end 21b of the detection winding 13 and the reference potential.

Here, when a current I flows on the measured wire 5 that has been inserted through the magnetic core 12, the magnetic flux that passes the first unit windings a and the second unit windings b changes due to the magnetic field generated in the periphery of the measured wire 5, which causes a detection current Id whose current value changes in keeping with the current value I1 of the current I to flow on a looped current path composed of the detection winding 13 and the detection resistor 14. The detection resistor 14 converts the detection current Id to a voltage Vd which is inputted into the differential detector 15. By amplifying the voltage Vd, the differential detector 15 generates a voltage signal So whose voltage value V1 changes in proportion to the current value I1 of the current I and outputs to the processor 2.

As one example, the processor 2 includes an A/D converter, a memory, and a CPU (none of which is illustrated), measures the voltage value V1 of the voltage signal So outputted from the current detector 1A, and calculates (measures) the current value I1 of the current I flowing on the measured wire 5 based on the measured voltage value V1. The processor 2 outputs the measured current value I1 to the outputter 3.

As one example, the outputter 3 is constructed of a display apparatus such as an LCD and displays the current value I1 outputted from the processor 2 on a screen. Note that in place of a display apparatus, the outputter 3 may be constructed of a variety of interface circuits, and as one example, it is possible to use a configuration that stores the current value I1 in a removable medium as a medium interface circuit and/or transfers the current value I1 via a network to an external apparatus as a network interface circuit.

Next, the operations of the current detectors 1A and 1B and the meter MS will now be described with reference to the drawings. Note that since the operations of the current detectors 1A and 1B are the same, the operation is described below with the current detector 1A as an example.

As described above, with the current detector 1A, when the current I is flowing on the measured wire 5 that has been inserted through the magnetic core 12, the magnetic flux that passes the first unit windings a and the second unit windings b changes due to the magnetic field generated in the periphery of the measured wire 5. Due to this, the detection current Id flows on a looped current path composed of the detection winding 13 and the detection resistor 14. The detection resistor 14 converts the detection current Id to the voltage Vd, and the differential detector 15 amplifies the voltage Vd to generate the voltage signal So whose voltage value V1 changes in proportion to the current value I1 of the current I. This voltage signal So is outputted to the processor 2.

The processor 2 measures the voltage value V1, calculates (measures) the current value I1 of the current I flowing on the measured wire 5 based on the measured voltage value V1, and outputs to the outputter 3. The outputter 3 displays the current value I1 on the screen. By doing so, measurement of the current value I1 of the current I by the meter MS is completed.

Here, as described above, with the current detectors 1A and 1B, the n first unit windings a of the first winding 22 on the first end 21a-side that construct the detection winding 13 and the n second unit windings b of the second winding 23 on the second end 21b-side that construct the detection winding 13 are alternately formed in the order described above on the outer surface of the magnetic core 12 in the 2n (the total number of the unit windings a and b) formation regions W set along the circumferential direction (the direction of the arrow K) of the magnetic core 12. With this configuration, in the current detectors 1A and 1B, since the $j^{th}$ first unit winding aj out of the first unit windings a and the $j^{th}$ second unit winding bj out of the second unit windings b are formed on the outer surface of the magnetic core 12 so as to not be adjacent (in the present embodiment, by using a preferred configuration where the unit windings a and b are formed with the same number of turns and are formed in the order described above in the formation regions W produced by equal partitioning so as to be at the most distant positions), even if the position of the measured wire 5 inside the magnetic core 12 changes, it is possible to greatly reduce fluctuations in the current value I1 measured at each position.

Figure 5:
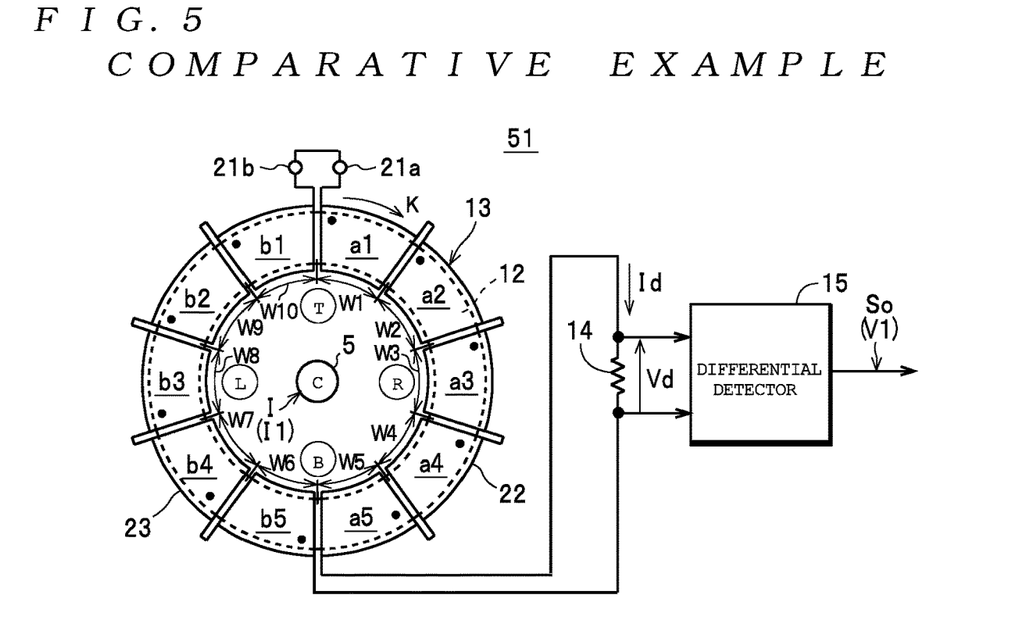
FIG. 5 is a diagram depicting the configuration of a current detector 51 as a comparative example.

The fluctuation reducing effect will now be described by comparing the current detector 1A as one example with a current detector 51 as a comparative example that corresponds to the current detector 1A. Note that the current detector 51 has the same configuration as the detection winding 13 depicted in FIGS. 1 and 2, that is, the magnetic core 12, the detection winding 13, the detection resistor 14, and the differential detector 15 and the configuration only differs in the formation positions of the first unit windings a1 to a5 and the second unit windings b1 to b5 in the formation regions W1 to W10 on the magnetic core 12. For this reason, in the description of the configuration of the current detector 51, elements that are the same have been assigned the same reference numerals and duplicated description thereof is omitted. Instead, only the formation positions of the first unit windings a1 to a5 and the second unit windings b1 to b5 in the formation regions W1 to W10 that differ will be described.

As depicted in FIG. 5, in the current detector 51, the five first unit windings a1, a2, a3, a4, and a5 and the five second unit windings b5, b4, b3, b2, and b1 are formed in that order along the direction of the arrow K starting from the first formation region W1 out of the 2n (=10) formation regions W1 to W10 set on the outer surface of the magnetic core 12. That is, in the current detector 51, the detection winding 13 is configured by forming the unit windings a and b in order on the outer surface of the magnetic core 12 from the first unit winding a1 that is positioned on the first end 21a side to the second unit winding b1 that is positioned on the second end 21b side.

For the current detector 1A and the current detector 51 of the configurations described above, in a state where a current I with a certain amplitude (or current value I1) and a certain frequency was flowing on the measured wire 5, the voltage value V1 of the voltage signal So was measured with the position of the measured wire 5 inside the magnetic core 12 set as depicted in FIGS. 1 and 5 at the positions labeled "C" (center), "T" (top), "R" (right), "B" (bottom), and "L" (left). With the voltage value V1 at the "center" as a reference value, errors (=(voltage value V1−reference value)/reference value×100) between the respective voltage values V1 at the "center", "top", "right", "bottom", and "left" and the reference value were then calculated. The results (that is, the error in amplitude at each wire position) are given below. A graphical representation of the results is given in FIG. 6. Note that in FIG. 6, the errors for the current detector 1A are depicted by a solid line and the errors for the current detector 51 are depicted by a broken line.

Figure 6:
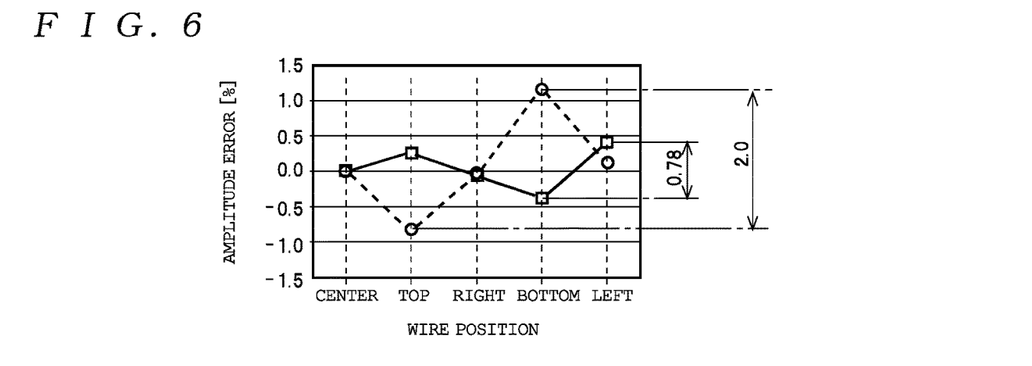
FIG. 6 is a characteristics graph useful in explaining amplitude errors at respective wire positions for the current detector 1A and the current detector 51.

Current detector 1A: "center" . . . 0.0, "top" . . . 0.26, "right" . . . −0.07, "bottom" . . . −0.38, "left" . . . 0.4

Current detector 51: "center" . . . 0.0, "top" . . . −0.83, "right" . . . −0.04, "bottom" . . . 1.17, "left" . . . 0.13

From the above results, although the difference between the largest value and the smallest value for the amplitude errors described above is 2.00 (=1.17−(−0.83)) for the current detector 51, the difference between the largest value and the smallest value for the amplitude errors described above is 0.78 (=0.4−(−0.38)) for the current detector 1A. Therefore, according to the current detector 1A, compared to the current detector 51, it has been confirmed that it is possible to significantly reduce fluctuations in properties (here, fluctuations in the amplitude (the voltage value V1)) that occur in the voltage signal So due to the position (or "wire position") inside the magnetic core 12 of the measured wire 5.

The reason why it is possible to reduce the fluctuations in the amplitude is as follows. Electrical losses due to parasitic capacitance and the like increase in the order of the two unit windings that are electrically closest to the detection resistor 14 out of the first unit windings a and the second unit windings b (in the example in FIG. 2, the first unit winding a5 and the second unit winding b5), the two unit windings that are electrically second closest to the detection resistor 14 (in the example in FIG. 2, the first unit winding a4 and the second unit winding b4), . . . , the two unit windings that are electrically fifth closest to the detection resistor 14 (in the example in FIG. 2, the first unit winding a1 and the second unit winding b1) due to the increase in the number of other unit windings present between these unit windings and the detection resistor 14. For this reason, by forming the two unit windings that are electrically furthest from the detection resistor 14 (that is, the first unit winding a1 and the second unit winding b1) in two formation regions W at positions that are the greatest distance apart out of the formation regions W on the outer surface of the magnetic core 12, forming the two unit windings that are electrically second furthest from the detection resistor 14 (that is, the first unit winding a2 and the second unit winding b2) in two formation regions W at positions that are as far apart as possible, and also forming the two unit windings that are electrically third furthest from the detection resistor 14 (that is, the first unit winding a3 and the second unit winding b3), the two unit windings that are electrically fourth furthest from the detection resistor 14 (that is, the first unit winding a4 and the second unit winding b4), and two unit windings that are electrically fifth furthest from (closest to) the detection resistor 14 (that is, the first unit winding a5 and the second unit winding b5) in the same way in pairs of formation regions W at positions that are as far apart as possible, it is possible to dispose pairs of unit windings that are electrically the same (that is, the pair of the first unit winding a1 and the second unit winding b1, the pair of the first unit winding a2 and the second unit winding b2, . . . , the pair of the first unit winding a5 and the second unit winding b5) at positions that are as far apart as possible. This means that it is possible to reduce fluctuations in electrical losses and thereby possible to reduce fluctuations in properties that occur in the voltage signal So according to the position of the measured wire 5.

For the current detector 1A and the current detector 51, with the phase of the current I flowing in the measured wire 5 as a reference, phase differences for the voltage signal So when the position of the measured wire 5 was at the respective positions labeled as "C" (center), "T" (top), "R" (right), "B" (bottom), and "L" (left) were measured and, with the phase difference at "center" as a reference value, the error (=(phase difference-reference value)/reference value× 100) between the phase difference and the reference value was calculated for the "center", "top", "right", "bottom", and "left". The results (the phase error at each wire position) are given below. A graphical representation of the results is given in FIG. 7. Note that in FIG. 7, the errors with the current detector 1A are depicted by a solid line and the errors with the current detector 51 are depicted by a broken line.

Figure 7:
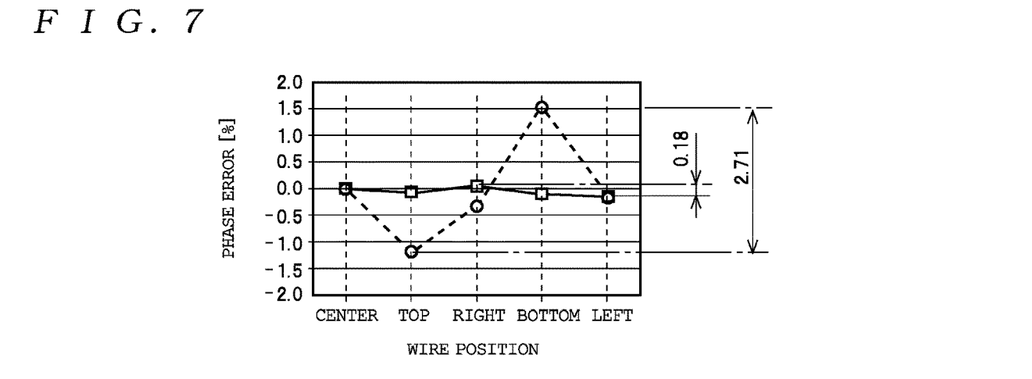
FIG. 7 is a characteristics graph useful in explaining phase errors at respective wire positions for the current detector 1A and the current detector 51.

Current detector 1A: "center" . . . 0.0, "top" . . . −0.07, "right" . . . 0.03, "bottom" . . . −0.11, "left" . . . −0.15

Current detector 51: "center" . . . 0.0, "top" . . . −1.19, "right" . . . −0.33, "bottom" . . . 1.52, "left" . . . −0.13

In the above results, although the difference between the largest value and the smallest value for the phase error described above is 2.71 (=1.52−(−1.19)) for the current detector 51, the difference between the largest value and the smallest value for the phase error described above is 0.18 (=0.03−(−0.15)) for the current detector 1A. Therefore, according to the current detector 1A, compared to the current detector 51, it has been confirmed that it is possible to significantly reduce fluctuations in properties (here, fluctuations in the phase) that occur in the voltage signal So due to the position (or "wire position") inside the magnetic core 12 of the measured wire 5. Note that since the reason why it is possible to reduce the fluctuations in phase is the same as the reason why it is possible to reduce the fluctuations in amplitude described above, description thereof is omitted here.

In this way according to the current detectors 1A, 1B and a meter MS equipped with either of these detectors, the detection winding 13 is constructed of the first winding 22 on the first end 21a side and the second winding 23 on the second end 21b side, the windings 22 and 23 are composed of the n first unit windings a and the n second unit windings b that each have the same number of turns, the first unit windings a are formed in odd-numbered formation regions W, out of the 2n formation regions W set by equally partitioning the outer surface of the magnetic core 12 with one of the formation regions W set as a first formation region W1, in order from the first unit winding a1 at the first end 21a-side of the detection winding 13 with the first formation region W1 as the starting formation region W, and the second unit windings b are formed in even-numbered formation regions W out of the 2n formation regions W in order from the second unit winding b1 at the second end 21b-side of the detection winding 13 in the same direction as the first unit windings a with an even-numbered formation region W that is most distant from the first formation region W1 as the starting formation region W. By doing so, out of configurations where the $j^{th}$ first unit winding aj out of the first unit windings a and the $j^{th}$ second unit winding bj out of the second unit windings b are not adjacent, a most preferred configuration, that is, a configuration where all of the pairs of a first unit winding aj and a second unit winding bj are at positions that are the greatest distance apart, can be easily and reliably realized. By using this configuration, according to the current detectors 1A and 1B and the meter MS, it is possible to significantly reduce fluctuations in properties (here, fluctuations in the amplitude (the voltage value V1) and the phase) that occur in the voltage signal So according to the position of the measured wire 5 inside the magnetic core 12.

Also, although the current detectors 1A and 1B described above use a configuration with the detection resistor 14 connected in advance to the detection winding 13, thereby making it possible to omit a task of separately preparing the detection resistor 14, the present invention is not limited to this configuration. As one example, when the current value I1 of the current I flowing on the measured wire 5 can be approximately predicted and the current value I1 covers a wide range, it is desirable to use a configuration where a detection resistor 14 of a resistance value that causes the voltage value of the voltage Vd generated by the detection resistor 14 to match the input rating of the differential detector 15 can be selected as appropriate. To do so, as depicted in FIGS. 1 and 3, for the current detectors 1A and 1B, it is also possible to use a configuration where a pair of resistor connecting terminals 31 (i.e., terminals for connecting the detection resistor 14 in series to the detection winding 13) are disposed on the detection winding 13 so that a detection resistor 14 of a desired resistance value can be connected between the pair of resistor connecting terminals 31.

Also, with the current detector 1A and 1B described above, as a most preferred configuration, a configuration is used where the first unit windings a and the second unit windings b are all formed with the same number of turns, the outer surface of the magnetic core 12 is accordingly equally partitioned into 2n formation regions W, the first unit windings a are formed in the odd-numbered formation regions W in order from the first unit winding a1 along the circumferential direction starting from the first formation region W1, and the second unit windings b are formed in the even-numbered formation regions W in order from the second unit winding b1 on the second end 21b side of the detection winding 13 in the same direction as the first unit windings a with the even-numbered formation region W that is most distant from the first formation region W1 in which the first unit winding a1 is formed as the starting formation region W, so that the $j^{th}$ first unit winding aj out of the first unit windings a and the $j^{th}$ second unit winding bj out of the second unit windings b are not adjacent (according to the preferred configuration in the present embodiment, so that these windings are at positions that are the greatest distance apart). However, the present invention is not limited to this configuration.

As one example, since it is sufficient for the $j^{th}$ first unit winding aj out of the first unit windings a and the $j^{th}$ second unit winding bj out of the second unit windings b to have the same number of turns, it is not necessary for all of the first unit windings a to have the same number of turns and not necessary for all of the second unit windings b to have the same number of turns. This means that it is possible to use a configuration where all of the first unit windings a have different numbers of turns and/or some but not all of the first unit windings a have the same number of turns (and the second unit windings b corresponding to the first unit windings a have the same configuration). Also, in place of a configuration where the 2n formation regions W are set by equally partitioning the outer surface of the magnetic core 12 into 2n partitions along the circumferential direction, it is also possible to use a configuration where different lengths are set, such as where the formation regions W have lengths in keeping with the number of turns in the first unit windings a and the second unit windings b to be formed in the respective formation regions W.

Also, since it is sufficient to use a configuration where the $j^{th}$ first unit winding aj and the $j^{th}$ second unit winding bj are formed at positions that are not adjacent along the circumferential direction (i.e., in winding regions W that are not adjacent), the positions (winding regions W) where the windings are to be formed are not limited to positions that are the greatest distance apart (the winding regions W that are the greatest distance apart) as in the configuration described above. As one example, it is also possible to use a configuration where the first unit windings a are formed in the odd-numbered formation regions W in order from the formation region W1 along the circumferential direction as described above but the second unit windings b are formed in order or randomly in the even-numbered formation regions W with an even-numbered formation region W that is not adjacent to the first formation region W1 in which the first unit winding a1 is formed as the starting formation region W. More specifically, for a configuration where the first unit windings a1, a2, a3, a4, and a5 are respectively formed in the odd-numbered formation regions W1, W3, W5, W7, and W9 as depicted in FIG. 1, although not illustrated, it is also possible to use a configuration where the second unit windings b1, b2, b3, b4, and b5 are formed in that order in the even-numbered formation regions W4, W6, W8, W10, and W2 with the even-numbered formation region W4 that is not adjacent to the first formation region1 W1 where the first unit winding a1 is to be formed as the starting formation region W (one example of a configuration where the first unit winding aj and the second unit winding bj are not adjacent and are as far apart as possible) and possible to use a configuration where part of the order of the second unit windings b1, b2, b3, b4, and b5 breaks down and the second unit windings b1, b3, b5, b4, and b2 are formed in that order in the even-numbered formation regions W8, W10, W2, W4, and W6 with the even-numbered formation region W8 that is not adjacent to the first formation region W1 as the starting formation region W (another example of a configuration where the first unit winding aj and the second unit winding bj are not adjacent and are as far apart as possible). It has been confirmed that when either of these configurations is used, compared to the current detector 51 described above, it is possible to reduce fluctuations in the properties described above that occur in the voltage signal So according to the position of the measured wire 5 inside the magnetic core 12.

The current detectors 1A and 1B are also not limited to a configuration where the detectors are used alone as current transformers as in the examples described above. Although not illustrated, by combining with a magnetic sensor such as a Hall element or a fluxgate sensor and having the detection winding 13 function as a feedback winding, it is possible to configure a zero-flux current detector. Also, with the current detectors 1A and 1B, although the number n of the first unit windings a that construct the first winding 22 and the number n of the second unit windings b that construct the second winding 23 are set at five and six in the examples described above, n may be any integer that is two or higher and it should be obvious that n may be two, three, four, or seven or higher. Although a current meter has been described as an example of the meter MS that is equipped with the current detectors 1A and 1B, it is also possible to configure a variety of meters, such as a power meter, aside from a current meter as a meter MS equipped with the current detectors 1A and 1B.

What is claimed is:

1. A current detector comprising:
   a ring-shaped magnetic core through which a measured wire is inserted;
   a detection winding formed on an outer surface of the magnetic core; and
   a pair of resistor connecting terminals disposed on the detection winding for connecting a detection resistor, which converts a current flowing in the detection winding due to a measured current flowing on the measured wire that has been inserted through the magnetic core to a voltage, in series to the detection winding,
   wherein the detection winding is composed of a first winding at a first end side and a second winding at a second end side that is connected in series to the first winding,
   the first winding is constructed by connecting n (where n is an integer that is three or higher) first unit windings in series,
   the second winding is constructed by connecting n second unit windings in series,
   the outer surface is partitioned into 2n formation regions along a circumferential direction of the magnetic core, and
   the n first unit windings are formed in odd-numbered formation regions along the circumferential direction with one out of the 2n formation regions as a first formation region, the n second unit windings are formed in even-numbered formation regions out of the 2n formation regions along the circumferential direction, and a $j^{th}$ (where j is an arbitrary integer in a range of 1 to n, inclusive) first unit winding from the first end side of the detection winding out of the first unit windings and a $j^{th}$ second unit winding from the second end side of the detection winding out of the second unit windings are not adjacent and are formed with an equal number of turns.

2. The current detector according to claim 1,
   wherein the detection resistor is connected between the pair of resistor connecting terminals.

3. A current detector comprising:
a ring-shaped magnetic core through which a measured wire is inserted;
a detection winding formed on an outer surface of the magnetic core; and
a detection resistor that is connected in series to the detection winding and converts a current flowing in the detection winding due to a measured current flowing on the measured wire that has been inserted through the magnetic core to a voltage,
wherein the detection winding is composed of a first winding at a first end side and a second winding at a second end side that is connected in series to the first winding,
the first winding is constructed by connecting n (where n is an integer that is three or higher) first unit windings in series,
the second winding is constructed by connecting n second unit windings in series,
the outer surface is partitioned into 2n formation regions along a circumferential direction of the magnetic core, and
the n first unit windings are formed in odd-numbered formation regions along the circumferential direction with one out of the 2n formation regions as a first formation region, the n second unit windings are formed in even-numbered formation regions out of the 2n formation regions along the circumferential direction, and a $j^{th}$ (where j is an arbitrary integer in a range of 1 to n, inclusive) first unit winding from the first end side of the detection winding out of the first unit windings and a $j^{th}$ second unit winding from the second end side of the detection winding out of the second unit windings are not adjacent and are formed with an equal number of turns.

4. The current detector according to claim 1,
wherein the $j^{th}$ second unit winding is formed in a formation region that is most distant along the circumferential direction from the formation region of the $j^{th}$ first unit winding.

5. The current detector according to claim 2,
wherein the $j^{th}$ second unit winding is formed in a formation region that is most distant along the circumferential direction from the formation region of the $j^{th}$ first unit winding.

6. The current detector according to claim 3,
wherein the $j^{th}$ second unit winding is formed in a formation region that is most distant along the circumferential direction from the formation region of the $j^{th}$ first unit winding.

7. The current detector according to claim 1,
wherein the 2n formation regions are produced by partitioning into equal lengths,
the n first unit windings are formed of an equal number of turns in order from the first unit winding on the first end side of the detection winding with the first formation region as a starting formation region,
the n second unit windings are formed of an equal number of turns in order from the second unit winding on the second end side of the detection winding in the same direction as the first unit windings, with an even-numbered formation region that is most distant along the circumferential direction from the first formation region out of the 2n formation regions as a starting formation region.

8. The current detector according to claim 2,
wherein the 2n formation regions are produced by partitioning into equal lengths,
the n first unit windings are formed of an equal number of turns in order from the first unit winding on the first end side of the detection winding with the first formation region as a starting formation region,
the n second unit windings are formed of an equal number of turns in order from the second unit winding on the second end side of the detection winding in the same direction as the first unit windings, with an even-numbered formation region that is most distant along the circumferential direction from the first formation region out of the 2n formation regions as a starting formation region.

9. The current detector according to claim 3,
wherein the 2n formation regions are produced by partitioning into equal lengths,
the n first unit windings are formed of an equal number of turns in order from the first unit winding on the first end side of the detection winding with the first formation region as a starting formation region,
the n second unit windings are formed of an equal number of turns in order from the second unit winding on the second end side of the detection winding in the same direction as the first unit windings, with an even-numbered formation region that is most distant along the circumferential direction from the first formation region out of the 2n formation regions as a starting formation region.

10. The current detector according to claim 4,
wherein the 2n formation regions are produced by partitioning into equal lengths,
the n first unit windings are formed of an equal number of turns in order from the first unit winding on the first end side of the detection winding with the first formation region as a starting formation region,
the n second unit windings are formed of an equal number of turns in order from the second unit winding on the second end side of the detection winding in the same direction as the first unit windings, with an even-numbered formation region that is most distant along the circumferential direction from the first formation region out of the 2n formation regions as a starting formation region.

11. The current detector according to claim 5,
wherein the 2n formation regions are produced by partitioning into equal lengths,
the n first unit windings are formed of an equal number of turns in order from the first unit winding on the first end side of the detection winding with the first formation region as a starting formation region,
the n second unit windings are formed of an equal number of turns in order from the second unit winding on the second end side of the detection winding in the same direction as the first unit windings, with an even-numbered formation region that is most distant along the circumferential direction from the first formation region out of the 2n formation regions as a starting formation region.

12. The current detector according to claim 6,
wherein the 2n formation regions are produced by partitioning into equal lengths,
the n first unit windings are formed of an equal number of turns in order from the first unit winding on the first end side of the detection winding with the first formation region as a starting formation region, the n second unit windings are formed of an equal number of turns in order from the second unit winding on the second end side of the detection winding in the same direction as the first unit windings, with an even-numbered formation region that is most distant along the circumferential direction from the first formation region out of the 2n formation regions as a starting formation region.

13. A meter comprising;

a current detector including a ring-shaped magnetic core through which a measured wire is inserted, a detection winding formed on an outer surface of the magnetic core, and a pair of resistor connecting terminals disposed on the detection winding for connecting a detection resistor, which converts a current flowing in the detection winding due to a measured current flowing on the measured wire that has been inserted through the magnetic core to a voltage, in series to the detection winding, wherein the detection winding is composed of a first winding at a first end side and a second winding at a second end side that is connected in series to the first winding, the first winding is constructed by connecting n (where n is an integer that is three or higher) first unit windings in series, the second winding is constructed by connecting n second unit windings in series, the outer surface is partitioned into 2n formation regions along a circumferential direction of the magnetic core, and the n first unit windings are formed in odd-numbered formation regions along the circumferential direction with one out of the 2n formation regions as a first formation region, the n second unit windings are formed in even-numbered formation regions out of the 2n formation regions along the circumferential direction, and a $j^{th}$ (where j is an arbitrary integer in a range of 1 to n, inclusive) first unit winding from the first end side of the detection winding out of the first unit windings and a $j^{th}$ second unit winding from the second end side of the detection winding out of the second unit windings are not adjacent and are formed with an equal number of turns;

a processor that measures a current value of the measured current based on the voltage converted by the detection resistor; and an outputter that outputs the measured current value.

14. A meter comprising;

a current detector including a ring-shaped magnetic core through which a measured wire is inserted, a detection winding formed on an outer surface of the magnetic core; and a detection resistor that is connected in series to the detection winding and converts a current flowing in the detection winding due to a measured current flowing on the measured wire that has been inserted through the magnetic core to a voltage, wherein the detection winding is composed of a first winding at a first end side and a second winding at a second end side that is connected in series to the first winding, the first winding is constructed by connecting n (where n is an integer that is three or higher) first unit windings in series, the second winding is constructed by connecting n second unit windings in series, the outer surface is partitioned into 2n formation regions along a circumferential direction of the magnetic core, and the n first unit windings are formed in odd-numbered formation regions along the circumferential direction with one out of the 2n formation regions as a first formation region, the n second unit windings are formed in even-numbered formation regions out of the 2n formation regions along the circumferential direction, and a $j^{th}$ (where j is an arbitrary integer in a range of 1 to n, inclusive) first unit winding from the first end side of the detection winding out of the first unit windings and a j' second unit winding from the second end side of the detection winding out of the second unit windings are not adjacent and are formed with an equal number of turns;

a processor that measures a current value of the measured current based on the voltage converted by the detection resistor; and an outputter that outputs the measured current value.

* * * * *